United States Patent [19]

Key et al.

[11] 4,204,089
[45] May 20, 1980

[54] KEYBOARD METHOD AND APPARATUS FOR ACCENTED CHARACTERS

[75] Inventors: Brian D. Key, Winchester; James Smith, Southampton; Shaun C. Kerigan, Harestock, all of England

[73] Assignee: International Business Machines Corporation, Armonk, N.Y.

[21] Appl. No.: 961,081

[22] Filed: Nov. 15, 1978

[30] Foreign Application Priority Data

Dec. 16, 1977 [GB] United Kingdom ............... 52383/77

[51] Int. Cl.² .......................... G06F 3/14; H04L 13/08
[52] U.S. Cl. ..................................... 178/30; 178/17.5; 340/365 S
[58] Field of Search ...................... 178/23 R, 17 C, 30, 178/79, 17.5, 26 R, 80; 340/365 S, 745, 748, 798, 803

[56] References Cited

U.S. PATENT DOCUMENTS

| | | | |
|---|---|---|---|
| 3,996,584 | 12/1976 | Plager | 340/745 |
| 4,063,029 | 12/1977 | Elstner | 178/17.5 |
| 4,072,820 | 2/1978 | Günther | 178/30 |

*Primary Examiner*—Thomas A. Robinson
*Attorney, Agent, or Firm*—Edward H. Duffield

[57] ABSTRACT

Keyboard apparatus is described in which a keyboard having dead-keys to enable accented characters to be entered is claimed. A storage means, preferably of read only type, is divided into a number of sections; each section contains character codes representing accented or non-accented characters associated with that section. When a given dead key is activated, this addresses a section of the store associated with that dead-key to access the section containing the characters which are accented with the accents associated with that dead key. Activation of the next character key causes accessing of the code for an accented character within that section. Different accents for the same or other characters can be associated with different dead keys. Optionally the store can be arranged to store only validly-accented characters, thus avoiding the entry of invalidly-accented characters. Non-accented characters are normally accessed from a single section of the store. Common accented characters do not require dead-key operation.

7 Claims, 8 Drawing Figures

| DEAD KEY SCAN CODES | | SECTION 1 (256-511 0-8) | | SECTION 2 (512-767 0-8) | | SECTION 3 (768-1023 0-8) | | SECTION 5 (256-511 9-17) | | SECTION 6 (512-767 9-17) | | SECTION 7 (768-1023 9-17) | |
|---|---|---|---|---|---|---|---|---|---|---|---|---|---|
| E00 | U/S | 5 | ~ | 1 | ·· | | | | | | | | |
|     | D/S | 6 | ∧ | 6 | ∧ | | | | | | | | |
| D11 | U/S | 1 | ·· | 3 | \ | 3 | \ | 6 | ∧ | 1 | ·· | | |
|     | D/S | 2 | / | 2 | / | 3 | \ | 3 | \ | 6 | ∧ | | |
| C11 | U/S | 6 | ∧ | 2 | / | 6 | ∧ | | | 1 | ·· | | |
|     | D/S | 5 | ~ | 7 | ɔ | 5 | ~ | | | 2 | / | | |
| E12 | U/S | 1 | ·· | 3 | \ | 3 | \ | 3 | \ | | | | |
|     | D/S | 6 | ∧ | 2 | / | 2 | / | 6 | ∧ | | | | |
| D12 | U/S | 6 | ∧ | 1 | ·· | 2 | / | | | | | | |
|     | D/S | 1 | ·· | 1 | ·· | 1 | ·· | | | | | | |
| C12 | U/S | | | | | 3 | \ | | | | | | |
|     | D/S | | | | | 2 | / | | | | | | |

| COUNTRY | E00 | D11 | C11 | E12 | D12 | C12 |
|---|---|---|---|---|---|---|
| USA / UK | | | | | | |
| JAPAN | ≈ | | | | ·· | > |
| BELGIUM | | | | ·× | | |
| ITALY | ·× | | | | | |
| PORTUGAL | | > | ≈ | | | |
| FINLAND | | | | > | ·× | |
| GERMANY | | | | > | | |
| CANADA | | \ | ⌐ | | | |
| SPAIN | | ∧ | ·· | | | |
| FRANCE | | ·× | | | | |
| SWITZERLAND | | | | ∧ | ·· | |

FIG. 6

| COUNTRY | FROM | TO | FROM | TO | FROM | TO |
|---|---|---|---|---|---|---|
| USA / UK | | | | | | |
| JAPAN | E00 | A | D12 | B | C12 | C |
| BELGIUM | E12 | A | | | | |
| ITALY | E00 | B | | | | |
| PORTUGAL | D11 | B | C11 | A | | |
| FINLAND | E12 | B | D12 | A | | |
| GERMANY | E12 | B | | | | |
| CANADA | D11 | C | C11 | B | | |
| SPAIN | D11 | E | C11 | F | | |
| FRANCE | D11 | F | | | | |
| SWITZERLAND | E12 | E | D12 | B | | |

FIG. 7

| SECTION 1 (¨) || SECTION 5 (~) ||
|---|---|---|---|
| ADDRESS | CONTENT | ADDRESS | CONTENT |
| ANY NON-DEAD KEY SCAN CODE DOWNSHIFT | ¨ ACCENTED CHARACTER CODES | ANY NON-DEAD KEY SCAN CODE DOWNSHIFT | ~ ACCENTED CHARACTER CODES |
| E 00 | ADDRESS OF SECTION 6 (∧) | E 00 | |
| D 11 | " " " 2 (/) | D 11 | ADDRESS OF SECTION 3 (\) |
| C 11 | " " " 5 (~) | C 11 | |
| E 12 | " " " 6 (∧) | E 12 | " " " 6 (∧) |
| D 12 | " " " 1 (¨) | D 12 | |
| C 12 | | C 12 | |
| ANY NON-DEAD KEY SCAN CODE UPSHIFT | ¨ ACCENTED CHARACTER CODES | ANY NON-DEAD KEY SCAN CODE UPSHIFT | ~ ACCENTED CHARACTER CODES |
| E 00 | ADDRESS OF SECTION 5 (~) | E 00 | |
| D 11 | " " " 1 (¨) | D 11 | ADDRESS OF SECTION 6 (∧) |
| C 11 | " " " 6 (∧) | C 11 | |
| E 12 | " " " 1 (¨) | E 12 | " " " 3 (\) |
| D 12 | " " " 6 (∧) | D 12 | |
| C 12 | | C 12 | |

| SECTION 2 (/) || SECTION 6 (∧) ||
|---|---|---|---|
| ADDRESS | CONTENT | ADDRESS | CONTENT |
| ANY NON-DEAD KEY SCAN CODE DOWNSHIFT | / ACCENTED CHARACTER CODES | ANY NON-DEAD KEY SCAN CODE DOWNSHIFT | ∧ ACCENTED CHARACTER CODES |
| E 00 | ADDRESS OF SECTION 6 (∧) | E 00 | |
| D 11 | " " " 2 (/) | D 11 | ADDRESS OF SECTION 6 (∧) |
| C 11 | " " " 7 (♭) | C 11 | |
| E 12 | " " " 2 (/) | E 12 | |
| D 12 | " " " 1 (¨) | D 12 | |
| C 12 | | C 12 | |
| ANY NON-DEAD KEY SCAN CODE UPSHIFT | / ACCENTED CHARACTER CODES | ANY NON-DEAD KEY SCAN CODE UPSHIFT | ∧ ACCENTED CHARACTER CODES |
| E 00 | ADDRESS OF SECTION 1 (¨) | E 00 | |
| D 11 | " " " 3 (\) | D 11 | ADDRESS OF SECTION 1 (¨) |
| C 11 | " " " 2 (/) | C 11 | |
| E 12 | " " " 3 (\) | E 12 | |
| D 12 | " " " 1 (¨) | D 12 | |
| C 12 | | C 12 | |
| SECTION 3 (\) || SECTION 7 (♭) ||

FIG. 8

KEYBOARD METHOD AND APPARATUS FOR ACCENTED CHARACTERS

TECHNICAL FIELD

This invention relates to keyboard apparatus in which key entered alphabetic characters are encoded for transmission to a utilization device such as a printer or display.

PRIOR ART

Keyboards used for data entry have, in the past, had a rather limited character set associated with them. So long as data processing equipment has been used by trained data processing personnel, the limited character set has not been too much of a drawback. However, in recent times, more people who have not received data processing training are beginning to use data processing equipment. There is an increasing demand to make the output of such equipment, whether the output be on a printer or on a display, more acceptable to non-DP users. Many printers and displays can now print or display full character sets in which all characters can be accented. However, it is still necessary for the characters to be entered into the equipment together with any accents associated with a particular character.

Typewriters have, for many years, been provided with "national keyboards" which enable accented characters to be typed. Normally, commonly used accents will be assigned a unique key on the keyboard. Thus, for example, it is common to find the character "ñ" on a Spanish keyboard but not on a French keyboard since the "tilde" is not used in the French language. Similarly, the characters "à", "ê" and "ù" will be found on most French typewriter keyboards but not on Spanish keyboards while the characters "ä", "ö" and "ü" will be found on German keyboards. Where an accent is infrequently used, or else is used frequently, but on many different characters, it is normal to associate that particular accent with a key: in this case an accented character can be selected by first entering the unaccented character, backspacing and then entering the accent. Such a procedure is acceptable with typewriters but gives rise to problems in modern word processing systems or, indeed, any data entry system in which characters are to be displayed.

In some modern word processing equipment, use is made of so-called "dead keys" to obviate the need for backspacing while entering accented characters which are not assigned a unique key. (It will be appreciated that the keyboard would be much too large if every possible accented character were assigned a unique key.) With a dead key, the operator first uses the dead key appropriate to the required accent and then uses the appropriate character key to produce a composite character. This dead key enters the accent but does not advance the display.

One further problem arising from national requirements is that even though two keyboards may contain the same characters their positions might be quite different. Thus, the position of the diaeresis and circumflex accents on a keyboard designed for Belgium is different from that on a keyboard design for Italy.

Because of these different national requirements, it is not practical to produce a "universal" keyboard. However, it is desirable that changes necessary to tailor a particular keyboard to a particular national requirement should be kept as simple as possible so that the economics of mass-production of keyboards are not lost.

OBJECTS

An object of the present invention is to provide an improved keyboard apparatus which may be adapted to national requirements without requiring extensive modifications.

SUMMARY

According to the present invention, the improved keyboard apparatus comprises a keyboard including at least one dead key with the (or each) dead key being associated with an accent. It further includes a store divided into a plurality of sections. One section of the store contains character codes representing a given character set and each of the other sections contains character codes representing characters of a set accented with an accent associated with that section. Means are included for providing coded signals indicative of the positions of keys which have been selected, and means responsive to a coded signal indicative of a non-dead key are included for accessing said store to read therefrom a character associated with that key and forming part of said character set. Further means are included responsive to a coded signal indicative of a dead key for accessing said store to obtain an address of the section containing character codes representing characters having the accent associated with that dead key. Further, the keyboard includes means responsive to a signal indicative of a non-dead key following an immediately preceding signal indicative of a dead key for accessing the section having the obtained address thereby to read from the store a character code representing a character accented with the accent associated with the dead key represented by said preceding signal.

BRIEF DESCRIPTION OF DRAWINGS

The invention will now be particularly described, by way of example, with reference to the accompanying drawings, in which:

FIG. 6 is a table showing how the various dead keys are assigned different accents in a selection of countries.

FIG. 7 is a chart showing how the dead keys can be connected to the read only store to meet the requirements of FIG. 4; and FIG. 8 shows details of the contents of the read only store.

Referring now to FIG. 1, a word processing system comprises a local controller 1 to which is connected a printer 2 and a local store 3 for containing text. A plurality of terminals consisting of a display 4 and keyboard 5 (and only one of which is shown) is connected to the controller 1 by means of transmission lines 6. Optionally, the controller 1 is connectable to a host processor 7 by means of a communication line 8, which is shown as a dial-up link but may be a channel attachment. A bulk store 9 controlled by the host processor 7 is adapted to contain text entered into the system on terminals connected to the controller 1 or from other terminals, not shown, connected through communications link 10.

Figure 1:
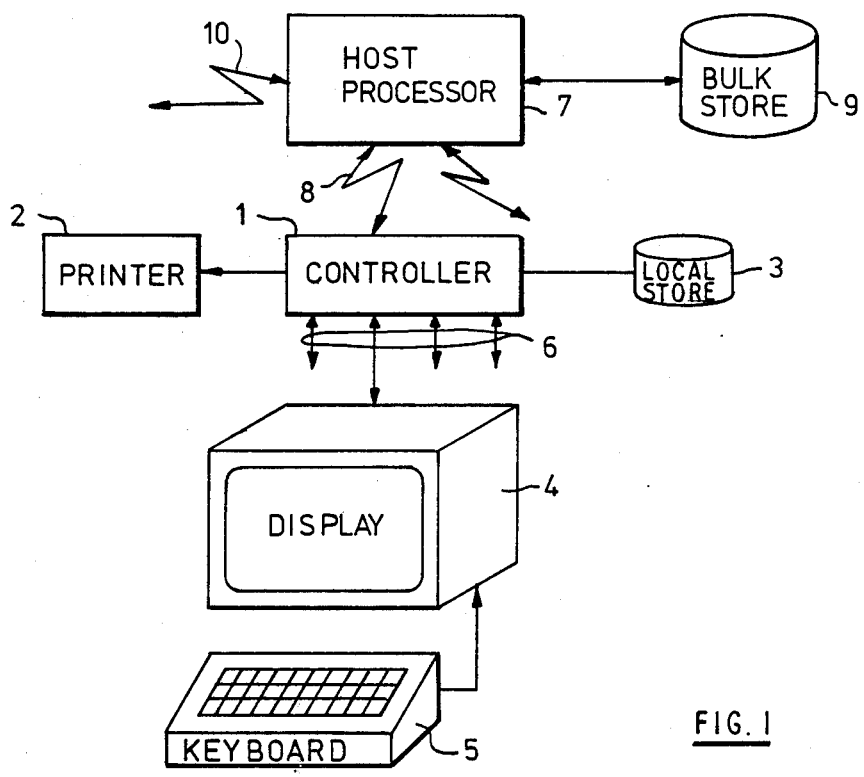
FIG. 1 is a schematic of keyboard apparatus in the form of a word processing system.

Such a word processing system is described in the complete specification of our co-pending application for Letters Patent Ser. No. 922,416, filed July 6, 1978. The terminal constituted by video display 4 and keyboard 1 can be constituted by an IBM (Registered Trademark) 3277 Model 2 video display unit modified as described in the aforementioned patent specification and in accordance with the teachings of the present application. The controller 1 can be constituted by an IBM (Registered Trademark) 3791 controller while host processor 7 can be constituted by an IBM (registered trademark) System 370 processor and the bulk store 9 by an IBM (registered trademark) 3850 data storage system or by any other suitable store such as a disc file. A suitable printer 2 and local store 3 is provided with the 3791 controller. Since details of the controller 1, printer 2, store 3, processor 7 and bulk store 9 are not necessary for an understanding of the present invention, they will not be further described.

Figure 2:
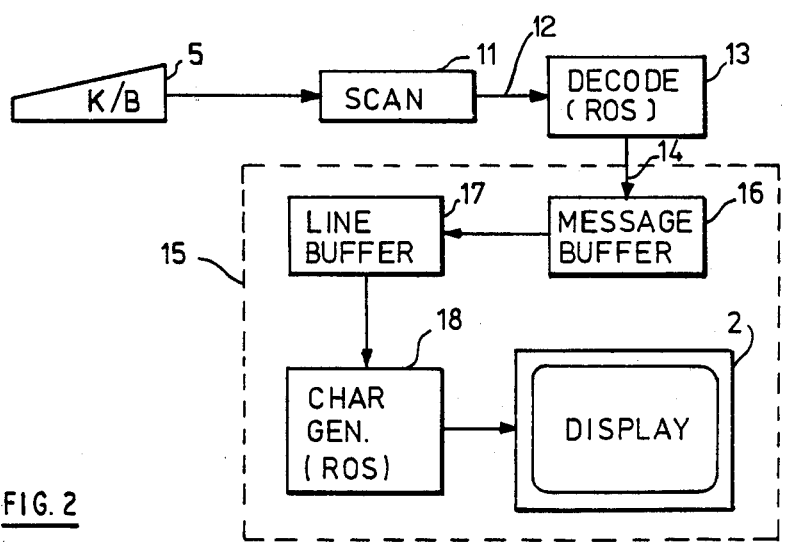
FIG. 2 is a block diagram of a data entry terminal.

FIG. 2 shows the relationship between the keyboard 5 and its associated display in somewhat more detail. Characters are entered by depressing keys on the keyboard 5 and scanner 11 produces an output on line 12 which indicates which key has been depressed. Signals on line 12 are decoded in decoder 13 which normally includes a read only store, to produce coded signals on line 14 which may be encoded, for example, in ASCII or EBCDIC format for use by the using apparatus 15. Although the using apparatus 15 is shown in the form of a video display unit, it will be appreciated that other forms of apparatus such as a printer or a communication transmitter are also applicable.

In the example shown where the using apparatus 15 is a video display unit, coded signals from line 14 and which are to be displayed on display 2 are accumulated in a message buffer 16. Characters to be displayed on one character line of the display 2 are assembled in a line buffer 17 which accesses a character generator 18, normally in the form of a read only store. The character generator 18 provides video signals on line 19 which controls movement of the electron beam within display 2. Further details of such a video display unit are given in the aforementioned patent specification. It will be appreciated however, that any other display apparatus, for example, a gas panel display, could constitute the using apparatus 15.

As indicated above, the keyboard 5 and scanner 11 together provide signals indicative of which key has been depressed (or activated where the keyboard is of the touch-key type) and may be of any convenient type. However, a preferred form of keyboard device is described in the complete specification of our U.K. Pat. No. 1,426,602 (U.S. Pat. No. 3,786,497) to which reference may be made for a complete understanding. Briefly, however, the scanner scans the various key positions in the keyboard and produces an output representative of the activated key position rather than of the actual character selected. This scan code is decoded using a read only store whose output is a character code representative of the key selected and which conveniently, but not essentially, may be in EBCDIC or ASCII format.

The present invention is concerned with how the scan code is decoded. Although U.S. Pat. No. 3,786,497 describes the use of a read only store which may be used in a self-addressing mode, no description is given as to how the read only store could be used to allow easy modification of a standard keyboard for different national requirements. Before describing the decoder in detail, reference will be made to FIG. 4 which shows a portion of a typical key layout of the keyboard. As is normal, keys 20 are arranged in rows and skewed columns. For convenience, the columns have been referenced 00 to 13 and the rows have been referenced A to E. Thus, the top left-hand key 21 can be identified as key E-00. Six of the keys 20 are shown shaded and are so-called dead-keys. In the particular example shown, keys E-00, E-12, D-11, D-12, C-11 and C-12 are all potential dead-keys. When any of these are depressed, it can be arranged that there will be no character advance and the character represented by the following key to be depressed will be appropriately accented.

FIG. 6 is a table showing how different ones of these dead-keys may be assigned different values (accents) in different countries. Where two accents are shown, the upper one represents the upshift of that key and the lower one represents the downshift of that key: where only a single accent is shown, this means that the same accent will be chosen whether the keyboard is in upshift or downshift. Blanks in the table represent keys which are not used for accents and which in the particular countries are not connected as dead-keys.

Figure 3:
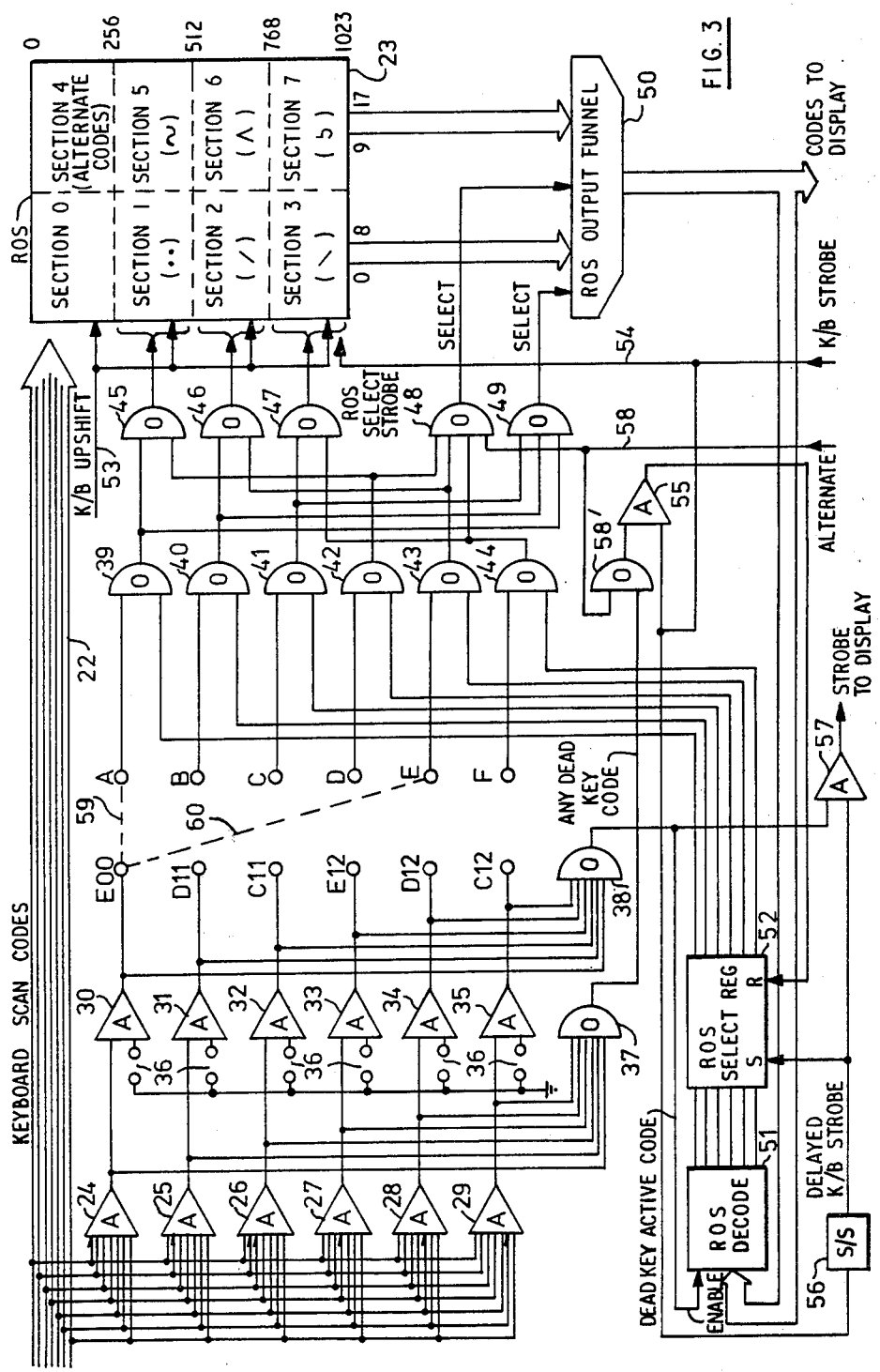
FIG. 3 is a logic diagram showing a preferred embodiment of the present invention.

Referring now to FIG. 3, keyboard scan codes are received on bus 22. A read only store (ROS) 23 of 1024×18 bits is divided by addressing an output byte selection into eight sections, each of 256×9 bits.

The scan coded output from the keyboard is used for the low order bits of the ROS address so that each scan code addresses a position in each of the ROS sections. The high order bits determine which section of the ROS 23 is to be selected. The ROS 23 is used for three purposes:

1. To translate scan codes from the keyboard into a form suitable for use by the using device.

2. To associate any dead key scan code with a particular accent.

3. To provide output codes for accented characters produced by dead-key operations.

To this end, ROS section 0 contains codes representing every key position on the keyboard for both upper and lower case shifts (upshift and downshift). These can represent non-accented characters or characters which are accented but do not require use of a dead key. Other ROS sections (except ROS section 4) contain identical codes to ROS section 0 except where an accented character is possible, or where the scan code from the keyboard could represent a dead-key. Each ROS section is allocated to a different accent so that ROS section 1 is associated with the diaeresis accent ( ¨ ), ROS section 2 with the acute accent ( ´ ), ROS section 3 with the grave accent ( ` ), ROS section 5 with the tilde ( ~ ), ROS section 6 with the circumflex accent ( ^ ), and ROS section 7 with the cedilla ( ¸ ). ROS section 4 contains alternate character codes representing a third shift of the keyboard and is selectable using an alternate code key on the keyboard. Thus, section 4 could contain character codes representing programming language characters. Although the character set in each of the ROS sections 1, 2, 3, 5, 6 and 7 could contain a replica of every character code of the character set in ROS section 0 modified to represent the appropriate accent added, it is preferred that only codes representing validly accented characters are stored: by this means if, for example, an operator incorrectly depresses a dead-key representing the diaeresis accent ( ¨ ) followed by the key representing "w", an unaccented "w" code will be selected, the character "ẅ" being invalid.

For all keyboard scan codes which can be assigned the dead-key function, only ROS section 0 contains an output code for each key. Other ROS sections use these addresses to store address codes which, when read out from the ROS, are used to select the ROS section appropriate to that dead-key accent. The following keyboard scan code will use that selected ROS section and the output will be a code representing the accented character. Thus, any scan code representing a non-dead key (and not preceded by a dead-key scan code) will give a coded output representing an accented or non-accented character from ROS section 0: any scan code representing a dead-key will select the appropriate ROS section (the same or different section) to be addressed by the next scan code which will produce a coded output representing an accented character if valid, or an unaccented character if invalid.

To allow for the purposeful creation of invalidly accented characters for making a special character, an operator would depress the appropriate character key, backspace, and then depress the appropriate accent key. This needs to be a deliberate action so that accidential invalidly-accented characters are avoided.

In the case where a dead-key is followed by a key which can be designated as a dead-key, the action taken normally depends on whether the second key has been actually selected to be a dead-key or not. If it has, the first dead-key is normally ignored and the second key stroke sets up the dead-key ROS selection again. If it has not, the ROS selection for the dead-key is reset and the output code from the ROS will be the normal code for that scan code obtained from ROS section 0. In some circumstances, it may be desirable to modify this operation to accommodate composite accents. Thus, if desired, two successive dead-key operations representing the acute and grave accents could be arranged so that the next followig non-dead-key operation accesses the circumflex section of the ROS.

Returning once more to FIG. 3, six AND gates 24 to 29 provided with different combinations of true and inverted inputs are used to decode the keyboard scan codes to determine whether a received scan code represents a potential dead-key. The outputs of AND gates 24 and 29 are connected, as shown, as inputs to AND gates 30 to 35 respectively. As shown, the other input of each of the AND gates 30 to 35 can be tied to ground by shorting across the appropriate terminal pairs 36 so that dead-keys not required for a particular national keyboard requirement can be de-activated. Thus, if none of the six potential dead-keys are required for a particular national keyboard (see FIG. 6) all of the terminal pairs 36 would be shorted to degate all the AND gates 30 to 35: ROS section 0 will be addressed by the scan code if the potential dead-key is not active. If an AND gate is not degated, it will provide an output whenever the corresponding key is depressed. The outputs of the AND gates 30 to 35 are connected to terminals E-00, D-11, C-11, E-12, D-12 and C-12 which correspond to the dead-keys shown in FIG. 4.

The outputs of AND gates 24 to 29 are connected to OR gate 37 whose output will indicate whether any potential dead-key has been selected. The outputs of AND gates 30 to 35 are connected to OR gate 38 whose output will indicate that an active dead-key (not tied off) has been selected. Six terminals A to F are connected to OR gates 39 to 44 respectively whose outputs are connected, as shown, to OR gates 45 to 47. The outputs of OR gates 39 to 44 are also connected, as shown to OR gates 48 and 49 whose outputs select bits 0 to 8 or 9 to 17 of the output of ROS 23. Thus, OR gate 39 connected to terminal A is used to control access of ROS section 1, OR gate 40 connected to terminal B controls access of ROS section 2, OR gate 41 connected to terminal C controls access of ROS section 3, OR gate 42 connected to terminal D controls access of ROS section 5, OR gate 43 connected to terminal E controls access of ROS section 6, and OR gate 44 connected to terminal F controls access of ROS section 7.

ROS output funnel 50 funnels the coded output of the selected ROS section to the display whenever a non-dead key is depressed and to ROS decoder 51 which is enabled by the output of OR gate 38 whenever an active dead-key has been depressed. The output of the ROS decoder 51 is connected to ROS selection register 52 whose six outputs are connected as shown to OR gates 39 to 44 allowing the appropriate ROS section for the code associated with that particular dead-key to be accessed. Thus, ROS section 1 for example, can be selected either by a signal at terminal A or by a signal from ROS select register 52.

A keyboard upshift signal on line 53 controls which part (upper or lower case) of the various ROS sections is accessed. A keyboard strobe signal on line 54 controls strobing of the ROS 23. Keyboard strobe signals are also connected to AND gate 55 and single shot 56 (which could be replaced by a simple delay circuit) which produces a delayed keyboard strobe signal. The delayed keyboard strobe signal is used to set the ROS select register 52 and is also applied to AND gate 57. The other input of AND gate 57 will degate a strobe pulse to the display whenever an active dead-key has been selected. This ensures that the output from ROS 23 is not strobed to the display but is used to select a ROS section. The output of the AND gate 55 is connected to reset the ROS select register 52.

Because their low order bits select positions within ROS sections, and high order bits select the required ROS sections, keyboard scan codes on bus 22 which are not indicative of potential dead-keys access the appropriate section of the ROS 23 without the intervention of the AND and OR gates described above except that access of ROS section 4 containing alternate codes is controlled by a signal from the alternate code key (not shown) on line 58 which is connected as an input to OR gate 48. To ensure that the alternate code key does not cause incorrect selection of the outputs of ROS 23 during dead-key operations, the alternate code key resets the ROS selection register 52 through OR gate 54' and AND gate 55.

A particular dead-key can be associated with a particular section of the ROS 23 by means of a jumper connecting one of the terminals A to F with one of the terminals E-00, D-11, C-11, E-12, D-12 and C-12. Thus, to associate the dead-key in the position E-00 (FIG. 4) with ROS section 1, a jumper would be connected between terminal E-00 (FIG. 3) with terminal A: this connection is represented by broken line 59. To associate dead-key terminal E-00 with ROS section 6, the jumper connection represented by broken line 60 would be used. FIG. 7 is a wiring chart showing the jumper connections to be made to associate various dead-keys with various accents in accordance with the table showing national keyboard requirements shown in FIG. 6. It will be noted that in the apparatus described, there are six keys which can be made dead-keys. From FIGS. 6 and 7, it will be seen that the maximum number required is 3. By providing more potential dead-key positions than are actually needed in any one counting, a choice of dead-key position, as well as of value, can be made.

Figures 4, 5:
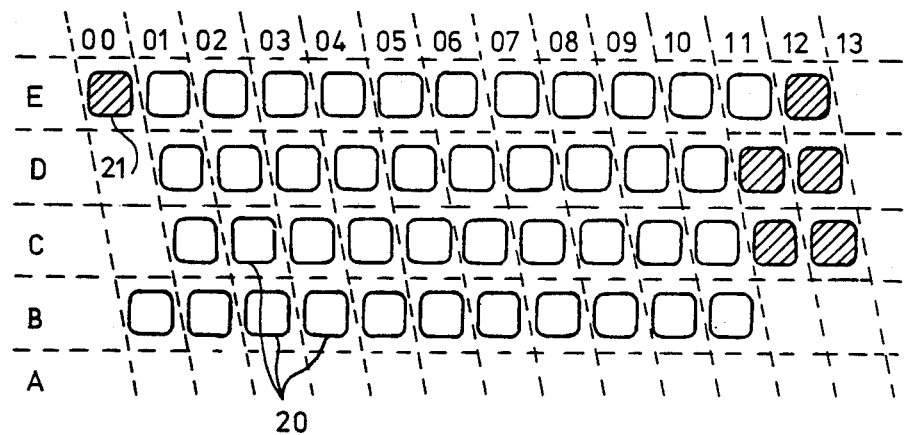
FIG. 4 shows part of the layout of a typical keyboard.
FIG. 5 is a table showing the relationship between dead keys in the keyboard shown in FIG. 4 with sections of a read-only-store shown in FIG. 3.

As stated above, addressing a ROS section using scan codes from dead-keys gives an output which is used to select another or the same ROS section where the accented characters are stored. FIG. 5 is a table showing which accents are allocated to the ROS sections for each dead-key scan code and FIG. 8 shows a section of the ROS and its contents. It will be seen from FIG. 6 that the dead-keys for Portugal are D-11 and C-11, D-11 defining a grave accent for upshift and an acute accent for downshift. From FIG. 5, it will be seen that these accents are coded in ROS section 2 for scan code address D-11 so for Portugal a jumper should connect terminal D-11 to terminal B. Similarly, for scan code address C-11, the upshift is the circumflex and the downshift is the tilde. These are coded in ROS section 1 for scan code C-11 (see FIGS. 5 and 8) so a jumper would connect terminal C-11 to terminal A for Portugal. With such a plugging arrangement, an operator pressing key D-11 will select ROS section 2 and address the D-11 location therein. The ROS output will select ROS section 3 if in upshift or ROS section 2 if in downshift: the next keystroke will address the accented version of the character (if valid) and this will be read from the ROS 23 and transferred to the display with a strobe pulse.

By a combination of plugging and indirect addressing of the ROS, many national requirements for keyboard layout can be met with one ROS design. The plugging identifies pairs of accents while the ROS itself selects the ROS section to which each accent relates. Although the invention has been described in terms of a read only store, this could be replaced by a writable store organized to be read in the same fashion. However, a read only store is preferred because of its cheapness.

The character codes from the read only store 23 are transmitted to the using device where they will be decoded. This will be normally done with a read only store in the using device which is tailored to that device. Thus, a character code from a "French keyboard" need not necessarily be decoded to display or print the same character as the same code from a "German keyboard".

Having thus described my invention, what I claim as new, and desire to secure by Letters Patent is:

1. Keyboard apparatus comprising:
a keyboard including at least one dead-key, each said dead-key being associated with a given type of character accent;
a storage means having a plurality of sections, one section thereof containing character codes representing a character set, each of the other sections thereof containing character code sets representing characters accented with accent marks of a type associated with each said other section;
means for providing coded signals indicative of the positions of said keys which have been selected;
means responsive to a coded signal indicative of selection of a non-dead-key for accessing said storage means to read therefrom a character code associated with that key and forming part of said character set;
means responsive to a coded signal indicative of selection of a dead-key for accessing said storage means to obtain an address of the section of said storage means containing character code sets representing characters accented with the accent marks associated with said dead-key; and
means responsive to a signal indicative of selection of a non-dead-key following an immediately preceding signal indicative of selection of a dead-key for accessing the section of said storage means having said obtained address, thereby enabling the reading from said storage means of a character code representing a character accented with the accent marks associated with said dead-key represented by said preceding signal.

2. Apparatus as described in claim 1, wherein:
each of said other sections of said storage means contains character code sets representing accented characters having accents which can be validly combined with those characters and character codes representing unaccented characters for the cases when the accents associated with that section cannot validly be combined with those characters.

3. Apparatus as described in claim 1, comprising:
a plurality of potential dead-keys;
and, means for selectively deactivating one or more of said potential dead keys to cause a deactivated dead-key to access a character code within said one section.

4. Apparatus as described in claim 2, comprising:
a plurality of potential dead-keys; and
means for selectively deactivating one or more of said potential dead keys to cause a deactivated dead-key to access a character code within said one section.

5. Apparatus as described in claim 3, wherein:
said deactivating means includes a plurality of AND gates, each AND gate associated with a different one of said potential dead-keys; and
means for degating the AND gate associated with each said potential dead-key required to be deactivated.

6. Apparatus as described in claim 4, wherein:
said deactivating means includes a plurality of AND gates, each AND gate associated with a different one of said potential dead-keys; and
means for degating the AND gate associated with each said potential dead-key required to be deactivated.

7. Apparatus as described in claim 1, or 2, or 3, or 4, or 5, or 6, comprising:
means for selectively associating each said dead-key with one of said other sections of said storage means.

* * * * *